(12) United States Patent
Schmitt et al.

(10) Patent No.: US 6,181,214 B1
(45) Date of Patent: Jan. 30, 2001

(54) VOLTAGE TOLERANT OSCILLATOR INPUT CELL

(75) Inventors: Jonathan A. Schmitt, Eden Prairie; Carol C. Anderson, Prior Lake, both of MN (US)

(73) Assignee: LSI Logic Corporation, Milpitas, CA (US)

(*) Notice: Under 35 U.S.C. 154(b), the term of this patent shall be extended for 0 days.

(21) Appl. No.: 09/448,677

(22) Filed: Nov. 24, 1999

(51) Int. Cl.$^7$ ................... H02H 7/20; H03B 5/36

(52) U.S. Cl. ............ 331/62; 331/108 C; 331/116 R; 331/116 FE; 331/158; 361/1; 361/111

(58) Field of Search .................... 331/18, 49, 59, 331/62, 108 C, 116 R, 116 FE, 158, 160; 307/326, 327; 361/1, 111

(56) References Cited

U.S. PATENT DOCUMENTS 6,078,487 * 6/2000 Partovi et al. ................... 361/56

* cited by examiner

Primary Examiner—David Mis
(74) Attorney, Agent, or Firm—David Brush; Westman, Champlin & Kelly

(57) ABSTRACT

An integrated circuit oscillator input cell has an oscillator input pad, an oscillator feedback pad, a core terminal, an inverter and an electrostatic discharge protection circuit. The inverter has an inverter input, which is coupled to the oscillator input pad, and an inverter output, which is coupled to the oscillator feedback pad and the core terminal. The electrostatic discharge protection circuit includes a plurality of N-channel protection transistors, which are coupled to the oscillator input pad. The N-channel protection transistors are the only protection transistors that are coupled to the oscillator input pad.

14 Claims, 3 Drawing Sheets

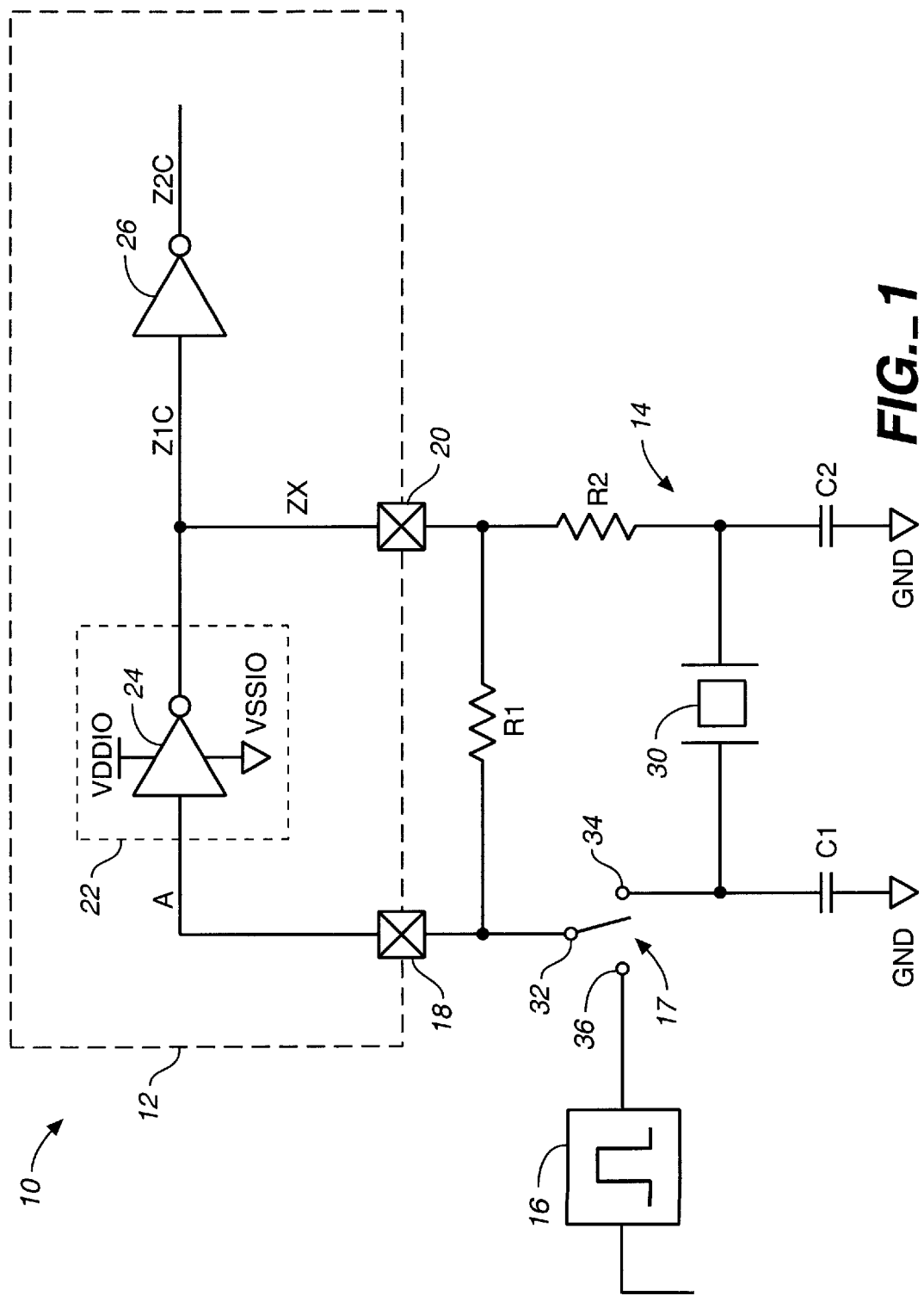
FIG._1

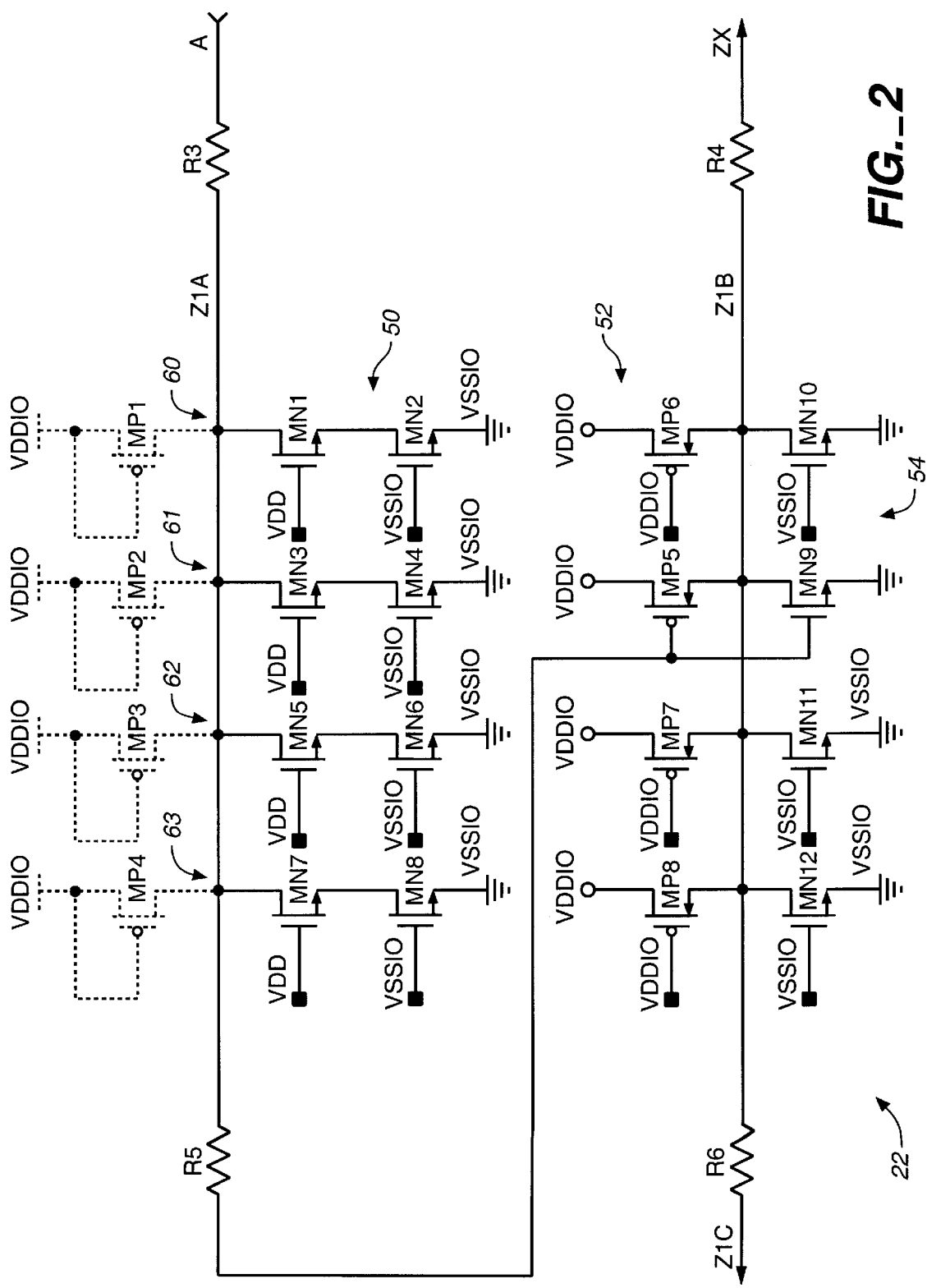
FIG._2

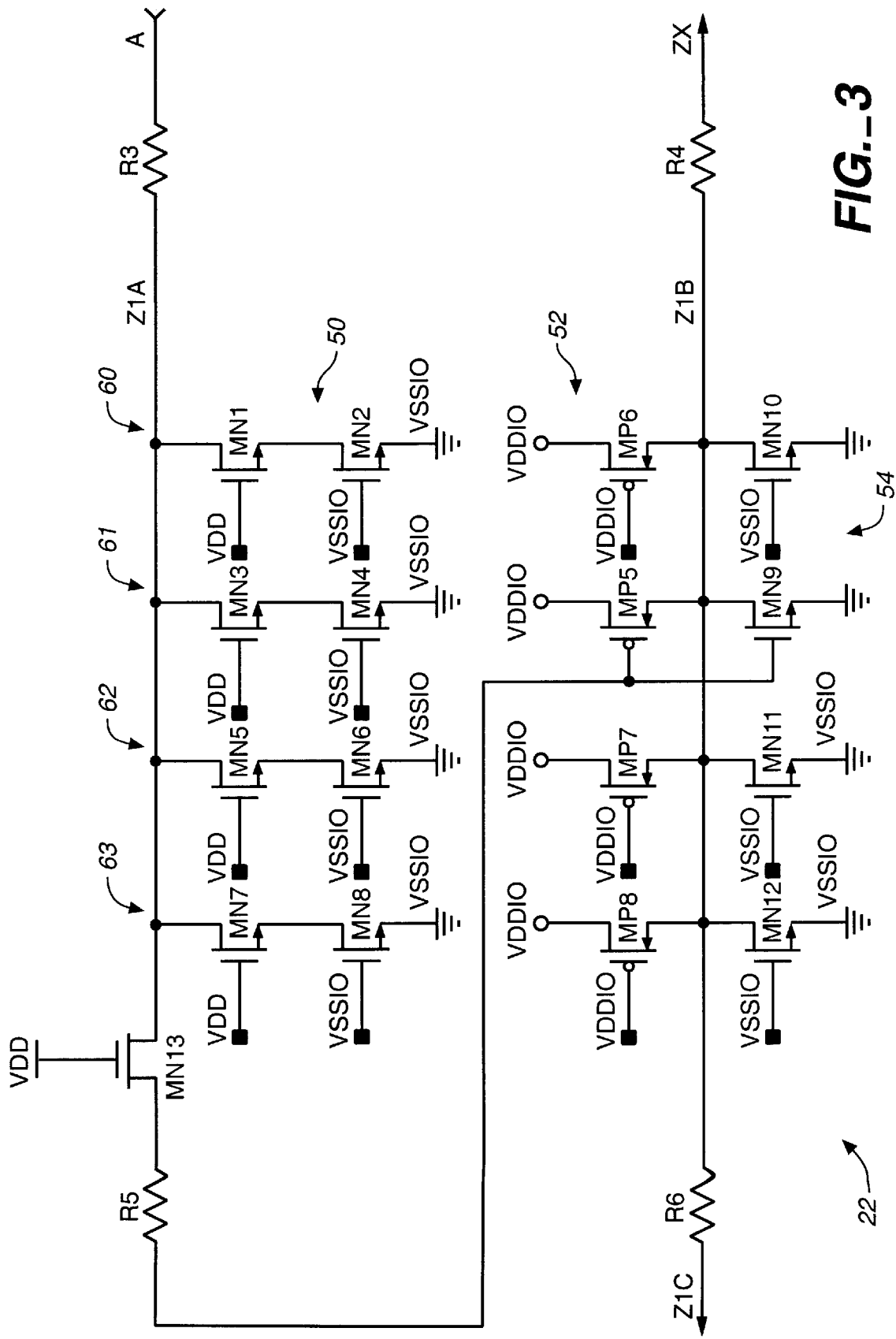
FIG._3

VOLTAGE TOLERANT OSCILLATOR INPUT CELL

BACKGROUND OF THE INVENTION

The present invention relates to semiconductor integrated circuits and, more particularly, to an oscillator input cell for a crystal oscillator circuit.

Semiconductor integrated circuits typically include clock inputs for coupling to a crystal oscillator or other clock signal source, which controls the sequential operation of the various clocked elements within the integrated circuit. When using a crystal oscillator, one of the input-output (I/O) pads on the integrated circuit serves as an oscillator input pad, and another I/O pad serves as an oscillator feedback pad. An oscillator input cell is placed in the I/O region on the integrated circuit, across the two I/O pads. The oscillator input cell has an inverter, which provides negative feedback from the oscillator input pad to the oscillator feedback pad to insure instability of the crystal oscillator circuit. The inverter output is also coupled to the core of the integrated circuit for providing a clock signal to the integrated circuit.

A typical oscillator input cell further includes electrostatic discharge (ESD) protection circuits coupled to the oscillator input pad and the oscillator feedback pad for clamping any voltage spikes received on the pads to the core supply voltage levels. A typical ESD protection circuit includes N-channel pull-down transistors and P-channel pull-up transistors, which are coupled between the pad and the respective voltage supply rail. These transistors are biased in an off state during normal operation. However, large ESD events will cause either the N-channel or the P-channel transistors to turn on, thereby clamping the pad to the respective voltage supply rail.

Typical oscillator input cells such as those described above are not tolerant to input voltages that are greater than the core voltage levels of the integrated circuit. This limits the type of clock signal sources that can be coupled to the oscillator input pad. As core supply voltage levels of integrated circuits continue to decrease, it becomes more difficult to interface with other integrated circuits having older technology. Also, it may not be desirable to operate external clock signals with reduced voltage swings at the board level.

Improved oscillator input cells that are tolerant to higher voltage swings are desired.

SUMMARY OF THE INVENTION

One aspect of the present invention relates to an integrated circuit oscillator input cell, which has an oscillator input pad, an oscillator feedback pad, a core terminal, an inverter and an electrostatic discharge protection circuit. The inverter has an inverter input, which is coupled to the oscillator input pad, and an inverter output, which is coupled to the oscillator feedback pad and the core terminal. The electrostatic discharge protection circuit includes a plurality of N-channel protection transistors, which are coupled to the oscillator input pad. The N-channel protection transistors are the only protection transistors that are coupled to the oscillator input pad.

Another aspect of the present invention relates to an oscillator circuit, which includes a semiconductor integrated circuit and an external crystal oscillator circuit. The semiconductor integrated circuit includes an oscillator input pad, an oscillator feedback pad, a core terminal, an inverter and an electrostatic discharge protection circuit. The inverter has an inverter input, which is coupled to the oscillator input pad, and an inverter output, which is coupled to the oscillator feedback pad and the core terminal. The electrostatic discharge protection circuit includes a plurality of N-channel protection transistors, which are coupled to the oscillator input pad. The N-channel protection transistors are the only protection transistors that are coupled to the oscillator input pad. The crystal oscillator circuit is coupled across the oscillator input pad and the oscillator feedback pad.

Yet another aspect of the present invention relates to an integrated circuit oscillator input cell, which includes an oscillator input pad, an oscillator feedback pad, a core terminal, an inverter and an electrostatic discharge protection circuit. The oscillator input pad receives an oscillating signal having one of a first voltage swing and a second voltage swing, wherein the second voltage swing is greater than the first voltage swing. The oscillator feedback pad and the core terminal have the first voltage swing. The inverter has an inverter input, which is coupled to the oscillator input pad, and an inverter output, which is coupled to the oscillator feedback pad and the core terminal. The electrostatic discharge protection circuit is coupled to the oscillator input pad for clamping the oscillator input pad in response to electrostatic discharge voltage spikes received on the oscillator input pad and for drawing substantially no current when the oscillator input pad has a voltage level within the first and second voltage swings.

BRIEF DESCRIPTION OF THE DRAWINGS

FIG. 1 is a schematic diagram of an oscillator circuit according to one embodiment of the present invention.

FIG. 2 is a schematic diagram of an oscillator input cell according to one embodiment of the present invention.

FIG. 3 is a schematic diagram of an oscillator input cell according to an alternative embodiment of the present invention.

DETAILED DESCRIPTION OF ILLUSTRATIVE EMBODIMENTS

FIG. 1 is a schematic diagram of an oscillator circuit 10 according to one embodiment of the present invention. Oscillator circuit 10 includes semiconductor integrated circuit 12, crystal oscillator circuit 14, pulse generator 16 and switch 17. Integrated circuit 12 includes input/output pads 18 and 20, which serve as an oscillator input pad and an oscillator feedback pad, respectively.

Crystal oscillator circuit 14 oscillates at the core supply voltage levels of integrated circuit 12. In one embodiment, integrated circuit 12 operates at 2.5 volts or 1.8 volts, for example. Other core supply voltage levels can also be used. In certain applications, it may be desirable to disconnect oscillator input pad 18 from crystal oscillator circuit 14, through switch 17, and connect it to external pulse generator 16. External pulse generator 16 can include a test clock signal source or another integrated circuit, for example. External pulse generators often have voltage swings, such as 3.3 volts, that are larger than the 2.5 volts or 1.8 volts at which integrated circuit 12 and crystal oscillator circuit 14 operate. Smaller voltage swings are more common with integrated circuits having newer technology. Also, clock signals having larger voltage swings may be more desirable at the board level since they are often cleaner than clock signals having smaller voltage swings.

In accordance with one embodiment of the present invention, integrated circuit 12 has an oscillator input cell 22 with an input "A", which is coupled to pad 18 and is tolerant to voltage swings that are greater than the core voltage supply levels of integrated circuit 12. Cell 22 includes an inverter 24, which is coupled to input A. The output of inverter 24 is coupled to oscillator feedback output "ZX" at oscillator feedback pad 20. Inverter 24 is biased between power terminal VDDIO and ground terminal VSSIO. Inverter 24 provides a negative gain from oscillator input pad 18 to oscillator feedback pad 20 for insuring instability of crystal oscillator circuit 14. Oscillator feedback output ZX oscillates between VDDIO and VSSIO.

The output of inverter 24 is also coupled to core terminal Z1C. Inverter 26 is coupled between core terminal Z1c and core terminal Z2C for inverting the clock signals generated on core terminal Z1C to their original polarity received on oscillator input pad 18. In one embodiment, core terminal Z2C oscillates between zero and 2.5 volts. Switch 17 includes contacts 32, 34 and 36. Contact 32 is coupled to oscillator input pad 18. Contact 34 is coupled to crystal oscillator circuit 14. Contact 36 is coupled to the output of pulse generator 16. Switch 17 has a first state in which contact 32 is coupled to contact 34, thereby coupling crystal oscillator circuit 14 to oscillator input pad 18 and decoupling pulse generator 16 from oscillator input pad 18. Switch 17 has a second state in which contact 32 is coupled to contact 36, thereby decoupling crystal oscillator circuit 14 from oscillator input pad 18 and coupling pulse generator 16 to oscillator input pad 18.

Crystal oscillator circuit 14 is an example of a Pierce-type oscillator circuit, which includes crystal 30, resistors R1 and R2 and capacitors C1 and C2. The first terminal of crystal 30 is coupled to contact 34 and to capacitor C1. Capacitor C1 is coupled between contact 34 and ground terminal GND. The second terminal of crystal 30 is coupled to a node between resistor R2 and capacitor C2. Resistor R2 and capacitor C2 are coupled together in series between oscillator feedback pad 20 and ground terminal GND. Resistor R1 is coupled between oscillator input pad 18 and oscillator feedback pad 20. Crystal oscillator circuit 14 has a frequency of oscillation, which is determined by the resistances of resistors R1 and R2, the capacitances of capacitors C1 and C2 and the gain provided by inverter 24. Other types of oscillator circuits can also be used with the present invention.

FIG. 2 is a schematic diagram illustrating oscillator input cell 22 in greater detail. Oscillator input cell 22 includes input A, oscillator feedback output ZX, core terminal Z1C, diffusion resistors R3 and R4, polysilicon resistors R5 and R6, electrostatic discharge (ESD) protection circuits 50 and 52 and inverter 54. Diffusion resistor R3 is coupled between input A and internal node Z1A. ESD protection circuit 50 is coupled between node Z1A and ground terminal VSSIO and includes pull-down circuits 60–63.

Pull-down circuits 60–63 are coupled in parallel with one another and include N-channel protection transistors MN1–MN8. Pull-down circuit 60 includes transistors MN1 and MN2, which are coupled together in series between node Z1A and ground terminal VSSIO. Transistor MN1 has a gate coupled to power terminal VDD, a drain coupled to node Z1A and a source coupled to the drain of transistor MN2. Transistor MN2 has a gate and source coupled to ground terminal VSSIO. In one embodiment, power terminal VDD is biased at 2.5 volts, and ground VSSIO is biased at zero volts. However, other bias levels can also be used.

During operation, transistor MN1 is normally on and transistor MN2 is normally off. Transistor MN1 is normally on since its gate is tied to power terminal VDD. Transistor MN2 is normally off since its gate is tied to ground terminal VSSIO. If the voltage on input A drops more than a gate-source threshold voltage below VSSIO, such as during an external ESD event, transistor MN2 turns on to clamp node Z1A at or near VSSIO.

Transistor MN1 is coupled between transistor MN2 and node Z1A to prevent "punch through" and long-term reliability problems caused by a hot electron effect when transistors MN1 and MN2 are driven at relatively high drain-to-source voltage levels. Transistor MN1 limits the drain-source voltages across transistor MN2. In an alternative embodiment, transistor MN1 and similar transistors MN3, MN5 and MN7 are eliminated.

Pull-down circuits 61–63 are substantially similar to pull-down circuit 61, with transistors MN3-MN8 being coupled together in a similar fashion as transistors MN1 and MN2. Any number of pull-down circuits can be used in accordance with the present invention.

A traditional ESD protection circuit of the prior art would include P-channel transistors MP1–MP4 (shown in phantom), which would be coupled between node Z1A and power terminal VDDIO. Power terminal VDDIO is biased at 2.5 volts, for example. Transistors MP1–MP4 would normally be off, but would turn on when the voltage on input A exceeds a gatesource threshold voltage above VDDIO.

This operation is sufficient when input A is driven by crystal oscillator 14 (shown in FIG. 1), which oscillates at the core supply voltage levels, such as between zero and 2.5 volts. However, when input A receives clock signals having a larger voltage swing, such as 0–3.3 volts, transistors MP1–MP4 can turn on during normal operation, resulting in undesirable leakage current. This effect is known as "back biasing".

In the present invention, only N-channel ESD protection transistors are coupled to node Z1A. There are no P-channel ESD protection transistors coupled to node Z1A. With no P-channel transistors, oscillator input cell 22 can receive clock signals having a larger voltage swing than the core supply voltage provided across VDDIO and VSSIO without causing undesirable leakage current in the cell.

Polysilicon resistor R5 is coupled between node Z1A and input Y of inverter 54. Inverter 54 includes N-channel transistor MN9 and P-channel transistor MP5. The gates of transistors MN9 and MP5 are coupled to inverter input Y and the drains of transistors MN9 and MP5 are coupled to inverter output Z1B. The source of transistor MN9 is coupled to ground terminal VSSIO, and the source of transistor MP5 is coupled to power terminal VDDIO. Diffusion resistor R4 is coupled between inverter output Z1B and oscillator feedback output ZX. Polysilicon resistor R6 is coupled between inverter output Z1B and core terminal Z1C.

ESD protection circuit 52 is coupled between inverter output Z1B and power and ground terminals VDDIO and VSSIO for clamping output Z1B in response to ESD events received on oscillator feedback output ZX. ESD protection circuit 52 includes N-channel transistors MN10, MN11 and MN12 and P-channel transistors MP6, MP7 and MP8. N-channel transistors MN10–MN12 are coupled together in parallel, between inverter output Z1B and ground terminal GND. The gates and sources of transistors MN10–MN12 are coupled to ground terminal VSSIO, and the drains of transistors MN10-MN12 are coupled to inverter output Z1B. P-channel transistors MP6–MP8 are also coupled together in parallel. The gates and sources of transistors MP6–MP8 are coupled to power terminal VDDIO, and the drains of transistors MP6–MP8 are coupled to inverter output Z1B. Transistors MN10–MN12 and MP6–MP8 are normally off, but turn on to clamp node Z1B to the respective voltage supply terminal in response to voltage spikes received on output ZX. Since output ZX oscillates at the core supply voltage levels (e.g., 0–2.5 volts), P-channel transistors MP6–MP8 remain off even when oscillator cell input A is driven at 0–3.3 volts.

When input A is driven by clock signals having a voltage swing that is larger than the core supply voltage levels (such as 0–2.5 volts), the clock signal generated on core input Z1C may have a shift in duty cycle, as compared to the clock signal generated by when input A is driven at the core supply levels. In one embodiment, inverter 54 has a switching level that is at about the midpoint between VDDIO and VSSIO. When input A oscillates between VDDIO and VSSIO, the duty cycle on core terminal Z1C is about 50 percent. When input A oscillates at a higher voltage swing, such as 0–3.3 volts, the duty cycle on core terminal Z1C will be lower. In this case, integrated circuit 12 can include further logic such as a phase-locked loop or a frequency divider to shift the duty cycle to a desired percentage.

In some technologies, the gates of transistors MN9 and MP5 may not be capable of tolerating higher voltage levels, such as 3.3 volts, that exceed the core supply voltage levels without resulting in damage to the transistors In these applications, an NMOS pass-gate transistor can be coupled in the current path between cell input A and inverter input Y.

FIG. 3 is a schematic diagram illustrating an alternative embodiment of the present invention having an NMOS pass-gate transistor. The same reference numerals are used in FIG. 3 as were used in FIG. 2 for the same or similar elements. N-channel pass-gate transistor MN13 has a drain coupled to node Z1A, a source coupled to polysilicon resistor R5 and a gate coupled to power terminal VDD. Transistor MN13 limits the voltages seen by the gates of transistors MN9 and MP5 in inverter 54. Other circuit configurations are also possible.

In summary, the oscillator input cell of the present is adapted to operate with a crystal oscillator at the core voltage levels of the integrated circuit, while being tolerant to clock signals having voltage swings that are greater than the core voltage levels. In one embodiment, the oscillator input cell is adapted to tolerate input clock signals having a 3.3 volt swing, while the crystal oscillator operates at 1.8 volts or 2.5 volts. The ability to receive clock signals having larger voltage swings is advantageous since larger voltage swings are more common and typically cleaner at a board level. This allows the integrated circuit to be used in a wide variety of applications without additional circuitry for level shifting external clock signals, such as those generated by pulse generator 16 shown in FIG. 1.

Although the present invention has been described with reference to preferred embodiments, workers skilled in the art will recognize that changes may be made in form and detail without departing from the spirit and scope of the invention. For example, the present invention can be implemented with various technologies in addition to CMOS. Various alternative circuit configurations can be used. The transistors shown in the figures can include individual transistors or an array of transistors coupled together in parallel with one another. The voltage supply terminals can be relatively positive or relatively negative depending upon the particular convention adopted and the technology used and can include a power supply bus or a biased reference terminal having a voltage other than that of the power supply bus, for example. The term "coupled" can include various types of connections or couplings and can include a direct connection or a connection through one or more intermediate components.

What is claimed is:

1. An integrated circuit oscillator input cell comprising:
    an oscillator input pad;
    an oscillator feedback pad;
    a core terminal;
    an inverter having an inverter input, which is coupled to the oscillator input pad, and an inverter output, which is coupled to the oscillator feedback pad and the core terminal; and
    a first electrostatic discharge protection circuit comprising a plurality of N-channel protection transistors, which are coupled to the oscillator input pad, wherein the N-channel protection transistors are the only protection transistors that are coupled to the oscillator input pad.

2. The integrated circuit oscillator input cell of claim 1 and further comprising a power terminal and a ground terminal and wherein the first electrostatic discharge protection circuit further comprises:
    a first N-channel pull-down circuit formed by first and second N-channel transistors coupled together in series between the oscillator input pad and the ground terminal.

3. The integrated circuit oscillator input cell of claim 2 wherein:
    the first N-channel transistor comprises a gate coupled to the power terminal, a drain coupled to the oscillator input pad and a source; and
    the second N-channel transistor comprises a gate coupled to the ground terminal, a drain coupled to the source of the first N-channel transistor and a source coupled to the ground terminal.

4. The integrated circuit oscillator input cell of claim 3 wherein the first electrostatic discharge protection circuit further comprises second, third and fourth N-channel pull-down circuits between the oscillator input pad and the ground terminal, in parallel with the first N-channel pull-down circuit.

5. The integrated circuit oscillator input cell of claim 1 and further comprising:
    a diffusion region resistor and a polysilicon resistor coupled in series between the oscillator input pad and the inverter input and wherein the first electrostatic discharge protection circuit is coupled to a node between the diffusion resistor and the polysilicon resistor.

6. The integrated circuit oscillator input cell of claim 1 and further comprising:
    a second electrostatic discharge protection circuit coupled to the inverter output.

7. The integrated circuit oscillator input cell of claim 6 and further comprising a power terminal and a ground terminal and wherein the second electrostatic discharge protection circuit comprises:
    a first N-channel transistor having a gate coupled to the ground terminal, a drain coupled to the inverter output and a source coupled to the ground terminal; and
    a first P-channel transistor having a gate coupled to the power terminal, a drain coupled to the inverter output and a source coupled to the power terminal.

8. The integrated circuit oscillator input cell of claim 6 wherein the second electrostatic discharge protection circuit further comprises:
   second and third N-channel transistors coupled in parallel with the first N-channel transistor; and
   second and third P-channel transistors coupled in parallel with the first P-channel transistor.

9. The integrated circuit oscillator input cell of claim 1 and further comprising:
   a diffusion region resistor coupled between the inverter output and the oscillator feedback pad; and
   a polysilicon resistor coupled between the inverter output and the core terminal.

10. The integrated circuit oscillator input cell of claim 1 and further comprising:
    a power terminal; and
    an N-channel pass gate having a source coupled to the oscillator input pad, a drain coupled to the inverter input and a gate coupled to the power terminal.

11. An oscillator circuit comprising:
    a semiconductor integrated circuit comprising:
      an oscillator input pad;
      an oscillator feedback pad;
      a core terminal;
      an inverter having an inverter input, which is coupled to the oscillator input pad, and an inverter output, which is coupled to the oscillator feedback pad and the core terminal; and
      an electrostatic discharge protection circuit comprising a plurality of N-channel protection transistors, which are coupled to the oscillator input pad, wherein the N-channel protection transistors are the only protection transistors that are coupled to the oscillator input pad; and
    an external crystal oscillator circuit coupled across the oscillator input pad and the oscillator feedback pad.

12. The oscillator circuit of claim 11 and further comprising:
    a pulse generator having a pulse output; and
    a switch coupled between the oscillator input pad and the crystal oscillator circuit and between the oscillator input pad and the pulse output, wherein the switch has a first state in which the crystal oscillator circuit is coupled to the oscillator input pad and the pulse output is decoupled from the oscillator input and a second state in which the crystal oscillator circuit is decoupled from the oscillator input pad and the pulse output is coupled to the oscillator input pad.

13. The oscillator circuit of claim 12 wherein the inverter output, the core terminal, and the oscillator feedback pad have a first voltage swing and wherein the pulse output has a second voltage swing, which is greater than the first voltage swing.

14. An integrated circuit oscillator input cell comprising:
    an oscillator input pad for receiving an oscillating signal having one of a first voltage swing and a second voltage swing, wherein the second voltage swing is greater than the first voltage swing;
    an oscillator feedback pad, which has the first voltage swing;
    a core terminal, which has the first voltage swing;
    an inverter comprising an inverter input, which is coupled to the oscillator input pad, and an inverter output, which is coupled to the oscillator feedback pad and the core terminal; and
    electrostatic discharge protection means coupled to the oscillator input pad for clamping the oscillator input pad in response to electrostatic discharge voltage spikes received on the oscillator input pad and for drawing substantially no current when the oscillator input pad has a voltage level within the first and second voltage swings.

* * * * *